(12) United States Patent
Zhai et al.

(10) Patent No.: US 7,745,264 B2
(45) Date of Patent: Jun. 29, 2010

(54) SEMICONDUCTOR CHIP WITH STRATIFIED UNDERFILL

(75) Inventors: Jun Zhai, San Jose, CA (US); Ranjit Gannamani, San Jose, CA (US); Srinivasan Parthasarathy, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 339 days.

(21) Appl. No.: 11/849,545

(22) Filed: Sep. 4, 2007

(65) Prior Publication Data

US 2009/0057928 A1 Mar. 5, 2009

(51) Int. Cl.
*H01L 21/48* (2006.01)
*H01L 23/28* (2006.01)

(52) U.S. Cl. ...................... 438/127; 257/787
(58) Field of Classification Search ............... None
See application file for complete search history.

(56) References Cited

U.S. PATENT DOCUMENTS

| | | | | |
|---|---|---|---|---|
| 5,981,313 A * | 11/1999 | Tanaka | .................. | 438/118 |
| 6,030,854 A * | 2/2000 | Mashimoto et al. | ......... | 438/106 |
| 6,049,038 A * | 4/2000 | Suzuki | .................. | 174/539 |
| 6,335,571 B1 * | 1/2002 | Capote et al. | ............... | 257/787 |
| 6,369,451 B2 * | 4/2002 | Lin | ..................... | 257/779 |
| 6,373,142 B1 * | 4/2002 | Hoang | ................. | 257/783 |
| 6,649,833 B1 * | 11/2003 | Caletka et al. | ............... | 174/541 |
| 6,674,172 B2 * | 1/2004 | Vincent | .................. | 257/777 |
| 6,768,209 B1 * | 7/2004 | Jiang et al. | ............. | 257/778 |
| 6,774,493 B2 * | 8/2004 | Capote et al. | ............ | 257/778 |
| 6,815,258 B2 * | 11/2004 | Vincent | .................. | 438/118 |
| 7,199,479 B2 * | 4/2007 | Wu | ...................... | 257/787 |
| 7,306,976 B2 * | 12/2007 | Feustel et al. | ............. | 438/127 |
| 2002/0089067 A1 * | 7/2002 | Crane et al. | ............ | 257/778 |
| 2003/0080437 A1 * | 5/2003 | Gonzalez et al. | ............ | 257/778 |
| 2004/0188862 A1 * | 9/2004 | Nagarajan et al. | ............ | 257/787 |
| 2007/0178627 A1 * | 8/2007 | Jiang et al. | ............ | 438/108 |
| 2007/0238220 A1 * | 10/2007 | Lii et al. | ............ | 438/106 |
| 2007/0278655 A1 * | 12/2007 | Gonzalez et al. | ............ | 257/690 |
| 2008/0044951 A1 * | 2/2008 | Bang et al. | ............ | 438/121 |

* cited by examiner

*Primary Examiner*—Scott B Geyer
(74) *Attorney, Agent, or Firm*—Timothy M. Honeycutt

(57) ABSTRACT

Various semiconductor chip underfills and methods of making the same are provided. In one aspect, a method of manufacturing is provided that includes coupling a semiconductor chip to a substrate to leave a gap therebetween, and forming an underfill layer in the gap. The underfill layer includes a first plurality of filler particles that have a first average size and a second plurality of filler particles that have a second average size smaller than the first average size such that the first plurality of filler particles is concentrated proximate the substrate and the second plurality of filler particles is concentrated proximate the semiconductor chip so that a bulk modulus of the underfill layer is larger proximate the substrate than proximate the semiconductor chip.

23 Claims, 4 Drawing Sheets

SEMICONDUCTOR CHIP WITH STRATIFIED UNDERFILL

BACKGROUND OF THE INVENTION

1. Field of the Invention

This invention relates generally to semiconductor processing, and more particularly to semiconductor chip underfills and methods of making the same.

2. Description of the Related Art

Many types of conventional packaged integrated circuits consist of a semiconductor chip flip-chip mounted to a package substrate. Electrical interconnections between the semiconductor chip and a package substrate are provided by a plurality of solder bumps. The materials used for the semiconductor chip, the solder bumps, and the package substrate are selected for certain desirable characteristics. For example, the semiconductor chip is usually composed of silicon or a laminate of silicon and silicon dioxide. Silicon is selected for its advantageous semiconductor properties. Solder is selected as a bump material due to its electrical conductivity and easy thermal reflow properties. Conventional organic package substrates are frequently composed of alternating layers of epoxy resins. The layers are relatively inexpensive to manufacture. Although these various materials provide certain favorable characteristics, there is a penalty for using disparate materials.

The use of dissimilar materials results in the semiconductor chip and the package substrate having rather different coefficients of thermal expansion (CTE). Indeed, the CTE of the substrate may be larger than the CTE of the semiconductor chip by a factor of ten or more. The differences in CTE between a semiconductor chip and the package substrate can, if not compensated for, impose tremendous stresses on the solder bumps. If the stresses are too large, bump failure and delamination can occur.

To compensate for differences in CTE between the semiconductor chip and the package substrate, manufacturers have, for some time, placed an underfill layer between the semiconductor chip and the package substrate. The conventional underfill is designed to have a CTE that falls somewhere in between the CTE of the chip and the CTE of the substrate. In a conventional process, the chip is mounted to the substrate and a solder reflow is performed. Next, an epoxy resin that includes a collection of filler particles of silica is deposited at the edges of a semiconductor chip after the chip is preliminarily coupled to the substrate. Surface tension forces tend to draw the deposited underfill material into the voids between the semiconductor chip and the substrate. A subsequent thermal cure sets the underfill material.

Conventional underfill materials have a bulk modulus and CTE that does not vary with depth. Accordingly, the bulk modulus at the top of the underfill layer is substantially the same as the bulk modulus at the bottom of the same layer. Unfortunately, the conventional underfill material may still present a rather abrupt difference in CTE relative to both the chip and the substrate.

The present invention is directed to overcoming or reducing the effects of one or more of the foregoing disadvantages.

SUMMARY OF THE INVENTION

In accordance with one aspect of the present invention, a method of manufacturing is provided that includes coupling a semiconductor chip to a substrate to leave a gap therebetween, and forming an underfill layer in the gap. The underfill layer includes a first plurality of filler particles that have a first average size and a second plurality of filler particles that have a second average size smaller than the first average size such that the first plurality of filler particles is concentrated proximate the substrate and the second plurality of filler particles is concentrated proximate the semiconductor chip so that a bulk modulus of the underfill layer is larger proximate the substrate than proximate the semiconductor chip.

In accordance with another aspect of the present invention, a method of manufacturing is provided that includes coupling a semiconductor chip to a substrate to leave a gap therebetween, and forming an underfill layer in the gap. The underfill layer includes a first plurality of filler particles that have a first average density and a second plurality of filler particles that have a second average density lower than the first average density such that the first plurality of filler particles is concentrated proximate the substrate and the second plurality of filler particles is concentrated proximate the semiconductor chip so that a bulk modulus of the underfill layer is larger proximate the substrate than proximate the semiconductor chip.

In accordance with another aspect of the present invention, a method of manufacturing is provided that includes forming a partially cured polymeric material layer that has a first bulk modulus on a surface of a semiconductor chip. The semiconductor chip is coupled to a substrate with the partially cured polymeric material facing towards the substrate to leave a gap therebetween. An underfill layer is formed in the gap between the partially cured polymeric material. The underfill layer includes a plurality of filler particles that provide the underfill layer with a second bulk modulus larger than the first bulk modulus of the partially cured polymeric material layer.

In accordance with another aspect of the present invention, an apparatus is provided that includes a semiconductor chip coupled to a substrate and an underfill layer between the semiconductor chip and the substrate. The underfill layer includes a first plurality of filler particles having a first average size and a second plurality of filler particles having a second average size smaller than the first average size such that the first plurality of filler particles is concentrated proximate the substrate and the second plurality of filler particles is concentrated proximate the semiconductor chip so that a bulk modulus of the underfill layer being larger proximate the substrate than proximate the semiconductor chip.

In accordance with another aspect of the present invention, an apparatus is provided that includes a semiconductor chip coupled to a substrate and an underfill layer between the semiconductor chip and the substrate. The underfill layer includes a first plurality of filler particles having a first average density and a second plurality of filler particles having a second average density lower than the first average density such that the first plurality of filler particles is concentrated proximate the substrate and the second plurality of filler particles is concentrated proximate the semiconductor chip so that a bulk modulus of the underfill layer is larger proximate the substrate than proximate the semiconductor chip.

In accordance with another aspect of the present invention, an apparatus is provided that includes forming a partially cured polymeric material layer having first bulk modulus on a surface of a semiconductor chip. A semiconductor chip is coupled to a substrate. An underfill layer is between the semiconductor chip and the substrate. The underfill layer has a first layer proximate the semiconductor chip and with a first bulk modulus, and a second layer proximate the substrate that includes a plurality of filler particles that provide the second layer with a second bulk modulus larger than the first bulk modulus of the first layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
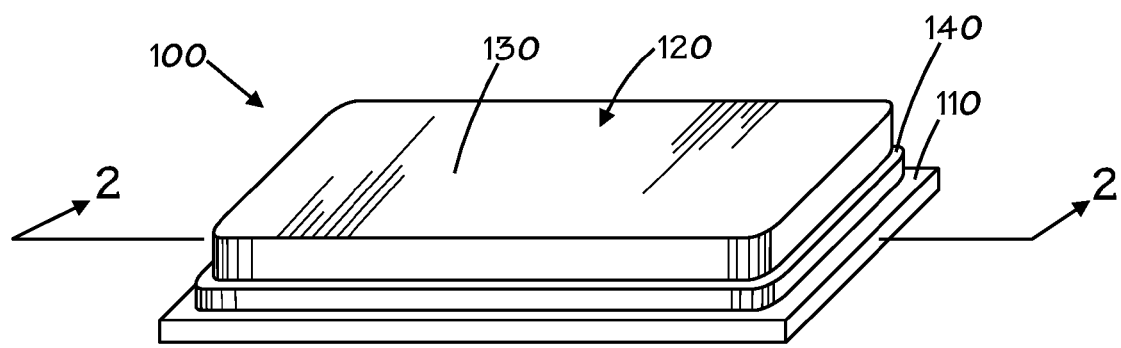
FIG. 1 is a pictorial view of an exemplary embodiment of a semiconductor chip package.

In the drawings described below, reference numerals are generally repeated where identical elements appear in more than one figure. Turning now to the drawings, and in particular to FIG. 1, therein is shown a pictorial view of an exemplary embodiment of a semiconductor chip package 100 that includes a base substrate 110 and a lid 120 seated thereon. The lid 120 is depicted as a top hat design that includes a crown portion 130 and a brim or flange portion 140. However it should be understood that the lid 120 may be configured as a standard bathtub design or other type of lid. Indeed, the lid 120 may be omitted entirely if a lidless design is desired. The substrate 110 is advantageously an organic substrate that may be standard core, thin core or coreless as desired.

Figure 2:
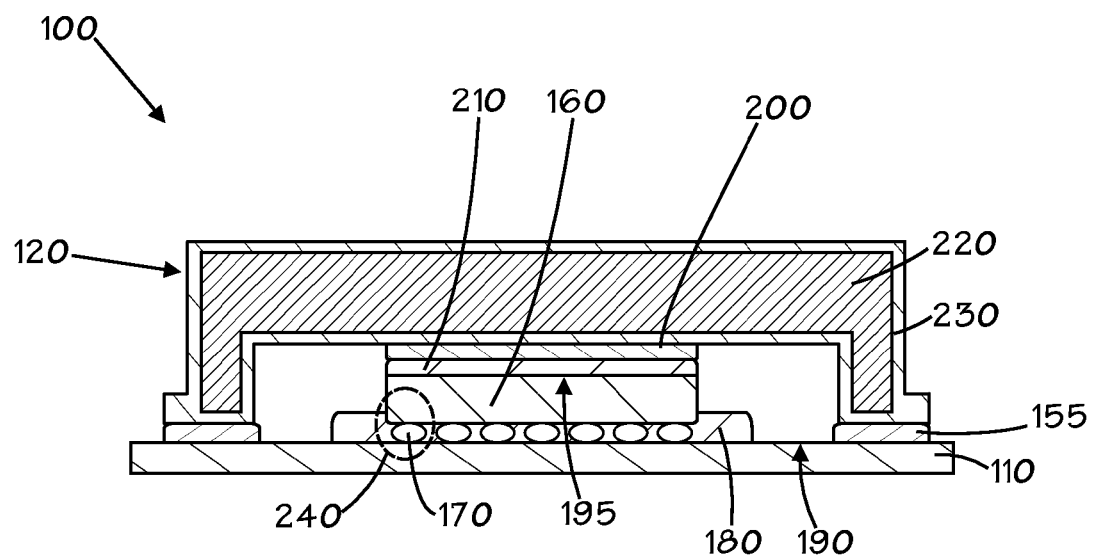
FIG. 2 is a sectional view of FIG. 1 taken at section 2-2.

Additional detail regarding the semiconductor chip package 100 may be understood by referring now also to FIG. 2, which is a sectional view of FIG. 1 taken at 2-2. The substrate 110 may be configured as a pin grid array, a ball grid array, a land grid array or any other type of interconnect scheme as desired. The lid 120 is secured to the substrate 110 by way of an adhesive bead 150. The adhesive 150 may be composed of a well-known thixotropic adhesive or other well-known type of package adhesive as desired. A semiconductor chip 160 is flip-chip mounted to the substrate 110. The semiconductor chip 160 may be any of a myriad of different types of circuit devices used in electronics, such as, for example, microprocessors, graphics processors, application specific integrated circuits, memory devices or the like, and may be single or multi-core. The semiconductor chip 160 may be fabricated using silicon, germanium or other semiconductor materials. If desired, the chip 160 may be fabricated as a semiconductor-on-insulator substrates. The semiconductor chip 160 may be electrically interconnected with the substrate 110 by a plurality of conductor structures 170. The conductor structures 170 may be solder structures or solder structures used in conjunction with conductive pillars composed of copper, gold, silver or the like.

To protect the conductor structures 170 from thermal strains due to differential coefficients of thermal expansion, an underfill material layer 180 is disposed between the semiconductor chip 160 and an upper surface 190 of the substrate 110. Unlike a conventional underfill layer, the underfill layer 180 is advantageously formed with a stratified bulk modulus. More details regarding the underfill layer 180 will be described below in conjunction with subsequent figures.

An opposite or backside 195 of the semiconductor die 160 may be provided with a thermal interface material 200 that is designed to facilitate the conductive heat transfer between the semiconductor die 160 and the lid 120. The thermal interface material 200 may be composed of polymeric materials such as, for example, silicone rubber mixed with aluminum particles and zinc oxide, or metallic materials, such as indium. Optionally, compliant base materials other than silicone rubber and thermally conductive particles other than aluminum may be used. If necessary to provide adequate wetting between the semiconductor die 160 and the thermal interface material 200, a back side metallization stack 210 may be provided on the back side of the semiconductor die 160. For example, the backside stack may be composed of successive layers of aluminum, titanium, nickel-vanadium and gold. The lid 120 may be composed of a variety of materials such as, for example, well-known plastics, ceramics or metallic materials as desired. Some exemplary materials include nickel plated copper, anodized aluminum, aluminum-silicon-carbon, aluminum nitride, boron nitride or the like. In an exemplary embodiment, the lid 120 may be composed of a copper core 220 surrounded by a nickel jacket 230.

Figure 3:
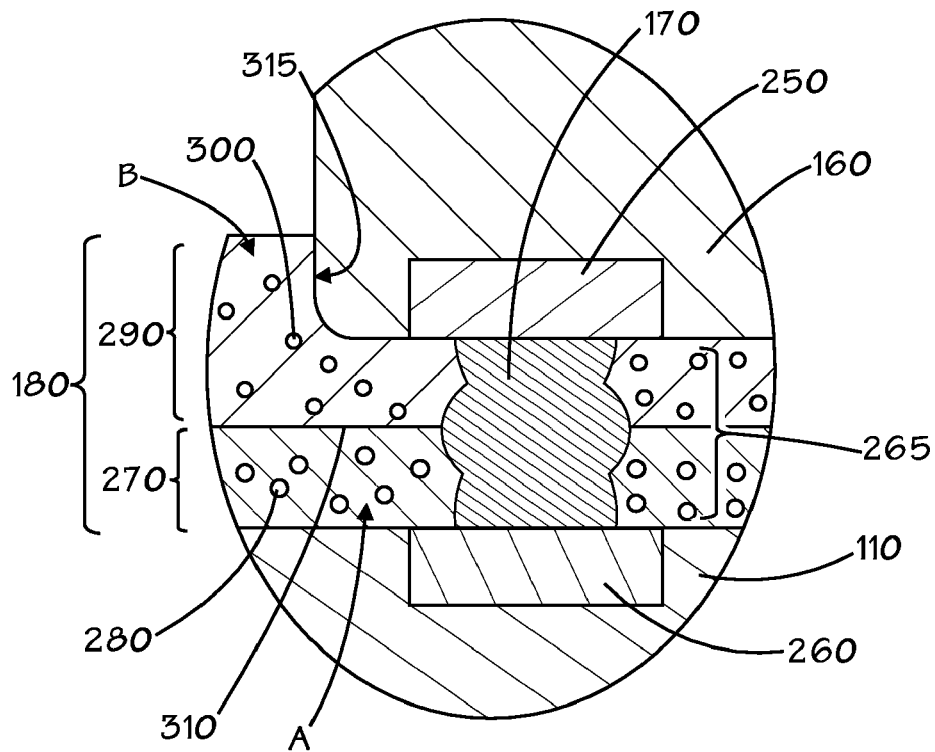
FIG. 3 is a select portion of FIG. 2 shown at greater magnification.

Attention is now turned to the small dashed oval 240 in FIG. 2. The portion of FIG. 2 circumscribed by the dashed oval 240 will be shown at greater magnification in FIG. 3. Attention is now turned to FIG. 3. Note that a small portion of the substrate 110 and the semiconductor chip 160, as well as the entire conductor structure 170, are visible in FIG. 3. Respective conductor pads 250 and 260 on the semiconductor chip 160 and the substrate 110 establish ohmic pathways with the conductor structure 170. The pads 250 and 260 may be composed of a variety of materials, such as, for example, copper, nickel, gold, platinum, silver, alloys of these or the like. As noted above, the conductor structure 170 may be composed of a solder bump structure as is depicted in FIG. 3 or other type of interconnect structure as desired. If solder is used, lead-free or lead-based solders may be used.

The underfill layer 180 is formed in a gap 265 between the substrate 110 and the semiconductor die 160. As noted above in conjunction with FIG. 2, the underfill layer 180 is fabricated with a stratified bulk modulus. It is desirable for the bulk modulus of the layer 180 to be higher near the substrate 110 and relatively lower near the semiconductor die 160. The bulk modulus and the CTE for a material are generally inversely proportional. The bulk modulus of the underfill layer 180 is stratified to reduce the CTE of the underfill layer 180 near the substrate 110 without significantly dropping it near the semiconductor chip 160. In this illustrative embodiment, the desired stratification of the bulk modulus of the underfill layer 180 is achieved by providing a lower portion 270 of the underfill layer 180 with a plurality of fill particles 280. In addition, an upper portion 290 of the underfill layer 180 is provided with a plurality of filler particles 300 that have an average size smaller than the average size of the particles 280. The horizontal line 310 between the portions 270 and 290 of the underfill layer 190 in FIG. 3 is merely an arbitrary graphical line in that the underfill layer 180 may be formed from a single matrix material and thus there will be no distinct border of the type depicted by the line 310. However, there will be some demarcation not unlike the border 310 where the relative concentration of the larger diameter particles 280 is in the majority and the concentration of the smaller diameter particles 300 is in the minority and vice versa. In any event, the goal is to elevate the bulk modulus of the portion 270 of the under fill 190 relative to the bulk modulus of the portion 290.

A variety of materials may be used for the particles 280 and 300. To avoid electrical shorts, insulating materials should be used. Examples include silica, alumina, diamond, sapphire or the like. In an exemplary embodiment, the particles 280 and 300 may be composed of silica and may be generally round in shape. However, other shapes may be used instead of spherical. In an exemplary embodiment, the particles 300 may have an average size of about 0.6 to 3.0 µm, while the larger particles 280 may have an average size of about 3.0 to 10.0 µm. Well-known epoxy resins may be used with the particles 280 and 300. A variety of particle-to-resin concentrations may be used. In an exemplary embodiment, the combined concentration of all of the particles 280 and 300 to resin may be about 40 to 70% on a volume basis. The ratio of the number of large particles 280 to small particles 300 may be about 1:1, although other ratios may be used.

To form the underfill layer 180, the particles 280 and 300 are mixed with a suitable resin. The resin is then deposited on the substrate 110 at an edge 315 of the semiconductor die 160 or at several edges thereof. Surface tension forces draw the resin and particle mix beneath the semiconductor die 160. As the resin flows beneath the die 160, the more massive larger particles 280 will tend to settle toward and concentrate proximate the substrate 110 more readily than the lower mass small particles 300 to begin creation of the aforementioned stratification of bulk modulus. After deposition, the underfill layer 180 is subjected to a thermal cure. A variety of parameters may be used for the cure depending on the epoxy used for the resin. In an exemplary embodiment, the cure may be performed at about 140 to 160° C. for about 60 to 120 minutes. The elevated temperatures may cause additional segregation of the small particles 300 from the large particles 280. The final underfill layer 180 with thus have the particles 300 concentrated near the chip 160 and the particles 280 concentrate near the substrate 110 and a bulk modulus that increases with depth. For example, at the location A, the layer 180 may have a bulk modulus of about 7 to 10 GPa and at the location A and about 0.5 to 2.5 GPa at the location B.

Figure 4:
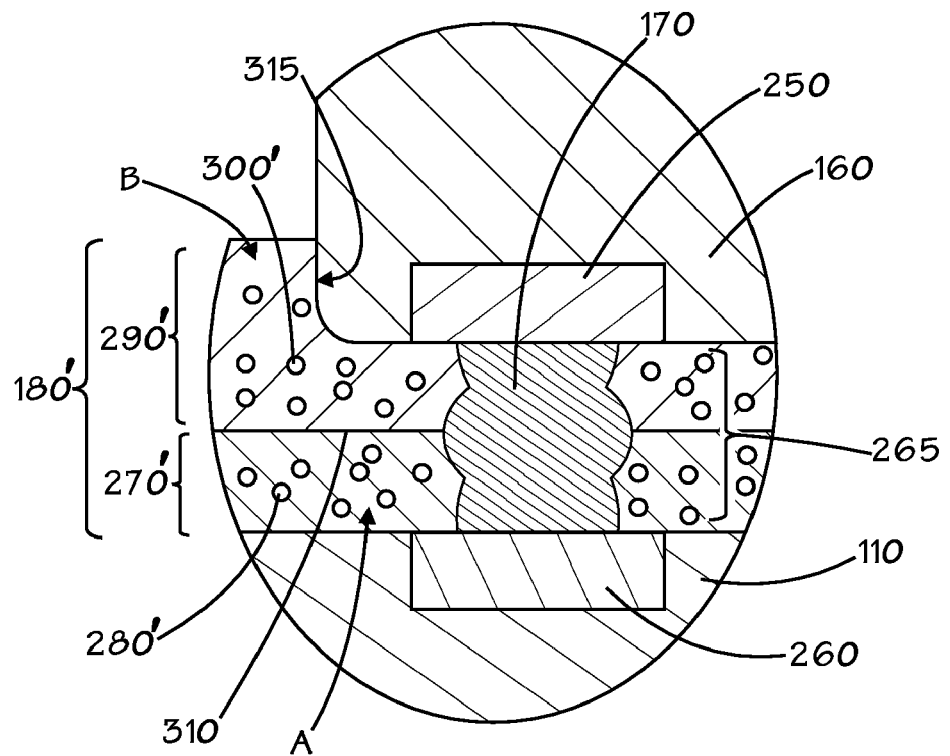
FIG. 4 is a view like FIG. 3 of an alternate exemplary embodiment of a semiconductor chip package.

In an alternate exemplary embodiment, the stratification of bulk modulus in the underfill material is achieved in a different fashion. Attention is now turned to FIG. 4, which is a sectional view like FIG. 3, but of an alternate exemplary embodiment of an underfill 180'. As in FIG. 3, FIG. 4 depicts small portions of the semiconductor chip 160 and the substrate 110, as well as the conductor structure 170 and the respective conductor pads 250 and 260. The underfill layer 180' is formed in the gap 265 and includes portions 270' and 290' that have respective bulk moduli that differ. The lower portion 270' is provided with a relatively higher bulk modulus than the upper portion 290' through the incorporation of a plurality of filler particles 280' composed of some material or combination of materials that has some density $\rho_1$. The portion 290' of the underfill layer 180' is provided with another plurality of filler particles 300' that are composed of some material or combination of materials that has a density $\rho_2$ that is lower than the density $\rho_1$ associated with the particles 280'. In this way, the higher density particles 280' will tend to settle faster than the lower density particles 300' and thus congregate in the portion 270'. As is the case with FIG. 3, the border 310 between the portions 270' and 290' in FIG. 4 is somewhat arbitrary and merely depicted to provide a general indication that a demarcation exists between portions of the under fill layer 180' that have majority concentrations of either the high density particles 280' or the low density particles 300'.

The low and high density particles 300' and 280' may be composed of a variety of materials such as, for example, silica, alumina, diamond, sapphire or the like. The material selected for the particles 280' should have a higher density than that the material selected for the particles 300'. For example, alumina may be selected for the particles 280' and silica may be selected for the particles 300'. The particles 300' and 280' may but need not have a round shape. In an exemplary embodiment, the particles 280' and 300' may have an average size of about 0.6 to 10.0 µm. Well-known epoxy resins may be used with the particles 280' and 300'. A variety of particle-to-resin concentrations may be used. In an exemplary embodiment, the combined concentration of all of the particles 280' and 300' to resin may be about 40 to 70% on a volume basis. The ratio of the number of large particles 280' to small particles 300' may be about 1:1, although other ratios may be used.

To form the underfill layer 180', the particles 280' and 300' are mixed with a suitable resin. The resin is then deposited on the substrate 110 at the edge 315 of the semiconductor die 160 or at several edges thereof. Surface tension forces draw the resin and particle mix beneath the semiconductor die 160. As the resin flows beneath the die 160, the more massive high density particles 280' will tend to sink toward the substrate 110 more readily than the lower density particles 300' to begin creation of the aforementioned stratification of bulk modulus. After deposition, the underfill layer 180' is subjected to a thermal cure. A variety of parameters may be used for the cure depending on the epoxy used for the resin. In an exemplary embodiment, the cure may be performed at about 140 to 160° C. for about 60 to 120 minutes. The elevated temperatures may cause additional segregation of the low density particles 300' from the higher density particles 280'. The final underfill layer 180' will thus have the particles 300' concentrated near the chip 160 and the particles 280' concentrated near the substrate 110 and a bulk modulus that increases with depth. For example, the layer 180' may have a bulk modulus of about 7 to 10 GPa at the location A and about 0.5 to 2.5 GPa at the location B.

Figure 5:
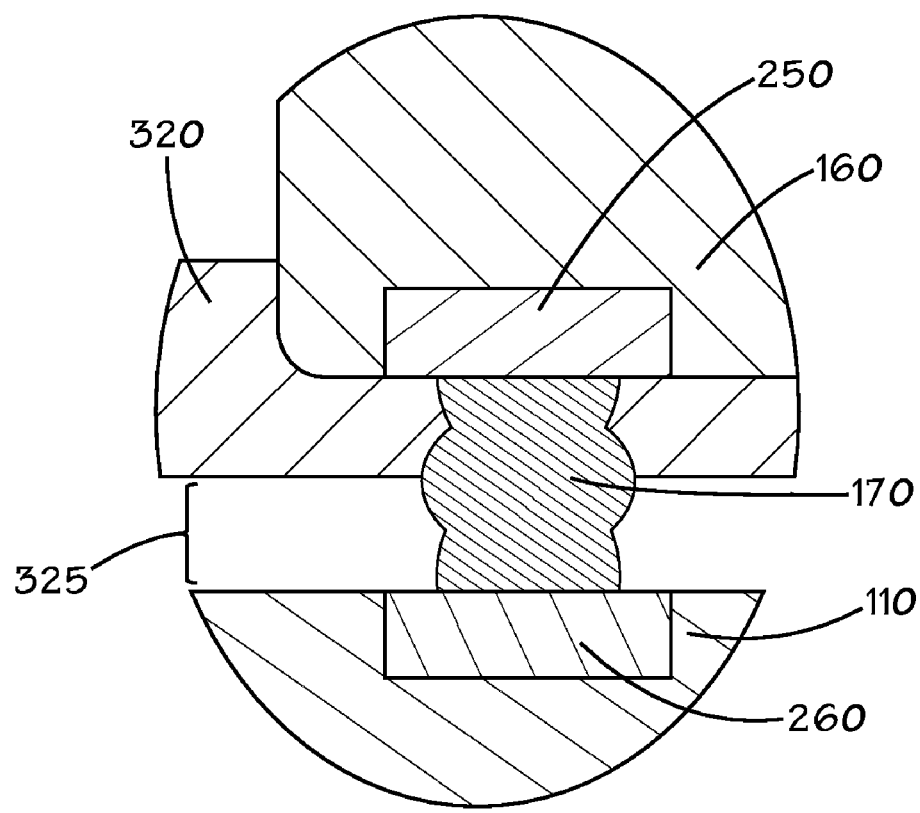
FIG. 5 is a view like FIG. 4 of another alternate exemplary embodiment of a semiconductor chip package.

In another alternate exemplary embodiment, a stratification of bulk modulus in an under fill layer may be achieved in a different fashion. Attention is now directed to FIG. 5, which is a sectional view like FIGS. 3 and 4, but depicts preliminary processing to fashion an underfill layer. In this regard, FIG. 5 depicts a small portion of the semiconductor chip 160, the substrate 110, the conductor structure 170, and the respective conductor pads 250 and 260. FIG. 5 depicts the semiconductor chip 160 just after mounting to the substrate 110 and a thermal reflow process to reflow the solder structure 170. Prior to mounting to the substrate 110, the semiconductor chip 160 may be provided with a so-called B-stage underfill layer 320 that has some desired relatively low bulk modulus of, for example, about 0.5 to 3.0 GPa. The layer 320 may be composed of well-known polymeric or B-stage, such as B-stage materials, such as, for example, well-known epoxies. Prior to mounting to the substrate 110, the B-stage underfill layer 320 is subjected to a partial cure to achieve partial but not complete cross-linking of the polymeric materials in the layer 320. In this way, the layer 320 will retain a certain viscosity. In an exemplary embodiment, the partial cure may be performed at about 150° C. for about 20 minutes. At this point, a gap 325 is present between the underfill layer 320 and the substrate 110. As discussed below, a second underfill layer is formed in the gap 325.

Figure 6:
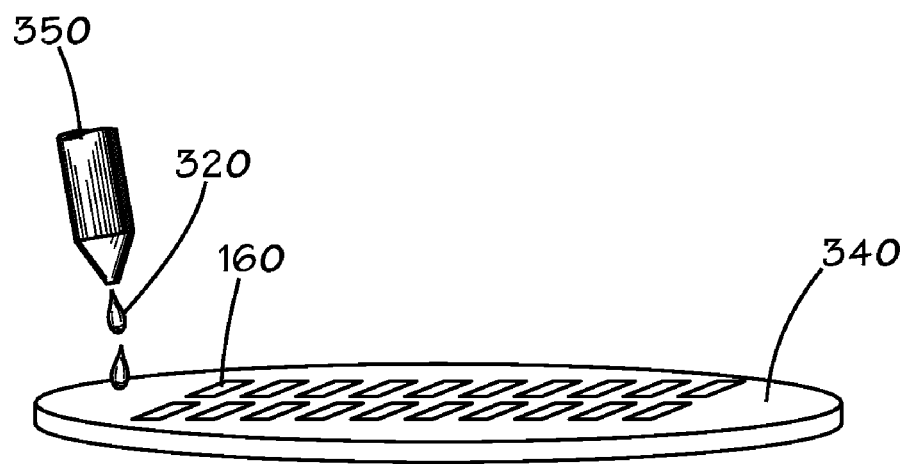
FIG. 6 is a pictorial view depicting an exemplary process of forming a partially-cured polymeric layer on a semiconductor wafer.

Although the layer 320 could be applied to the semiconductor chip 160 on an individual basis, a bulk processing may advantageously be used. In this regard, FIG. 6 shows a semiconductor wafer 340 that has a plurality of semiconductor dice 160 incorporated therein. The B-stage underfill 320 may be applied by a spray nozzle or other device 350 and the wafer 340 may then be subjected to the aforementioned partial cure to achieve partial cross-linking of the B-stage material 320.

The semiconductor wafer 340 may then be diced to produce the individual semiconductor chips 160 and the substrate mounting depicted in FIG. 5 may be performed.

Figure 7:
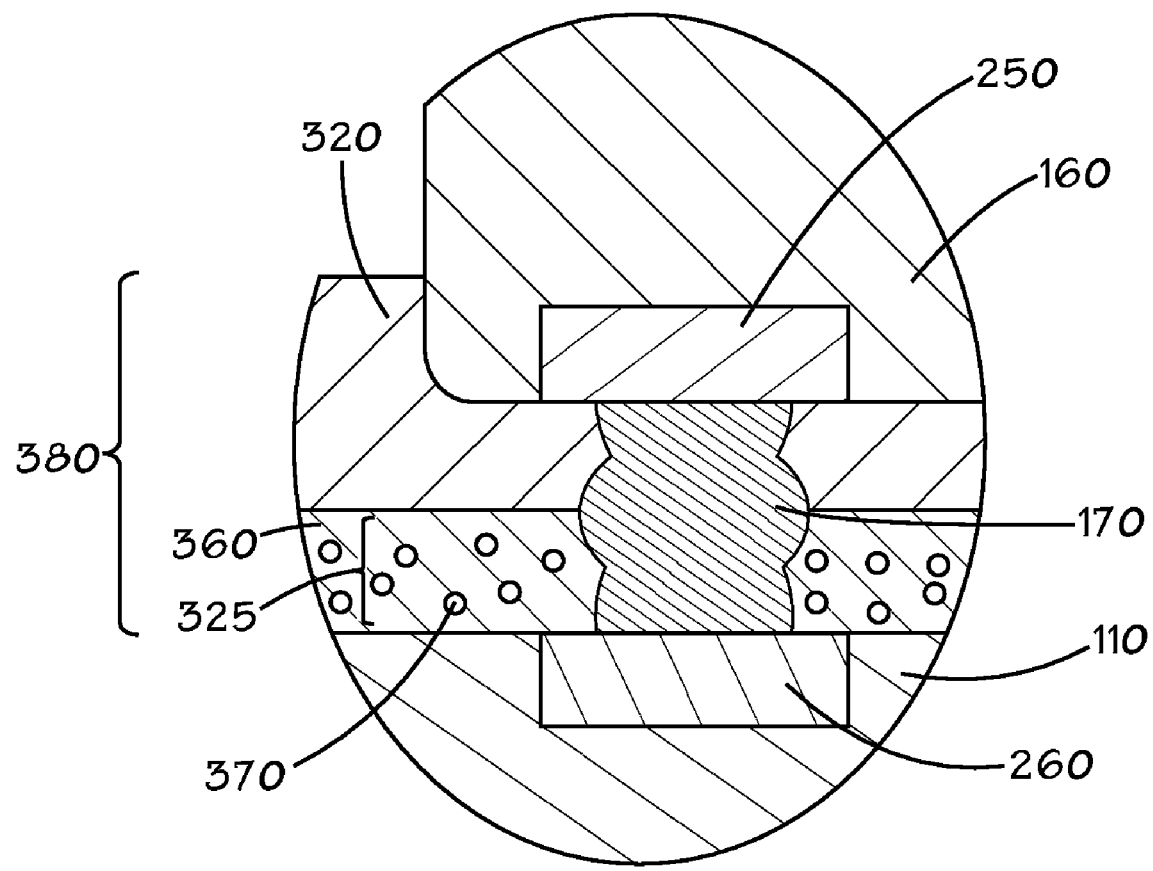
FIG. 7 is a view like FIG. 4, but of an alternate exemplary embodiment of a semiconductor chip package.

Attention is now turned to FIG. 7, which is a sectional view like FIG. 5 but depicts the addition of a second underfill layer 360 in the gap 325. The second underfill layer 360 may consist of a higher modulus underfill material composed of well-known epoxies with filler particles 370 that may be composed of, for example, silica, alumina, diamond, sapphire or the like. A final cure may then be performed to finally cure both the lower modulus underfill layer 320 and the higher modulus underfill layer 360. In an exemplary embodiment, the final cure may be performed at about 150 to 175° C. for about 30 to 120 minutes. The end product is an underfill layer 380 that consists of the layers 320 and 360 and exhibits the desired stratification of bulk modulus. Thus, the bulk modulus of the layer 380 may be about 7 to 10 GPa at location A and about 0.5 to 2.5 GPa at location B.

The skilled artisan will appreciate that the techniques for stratified bulk modulus may be applied to other package substrates. For example, the techniques may be applied to semiconductor chips mounted to other types of substrates, such as motherboards, daughter boards, cards or the like.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   coupling a semiconductor chip to a substrate to leave a gap therebetween; and
   forming an underfill layer in the gap, the underfill layer including a first plurality of filler particles having a first average density and a second plurality of filler particles having a second average density lower than the first average density such that the first plurality of filler particles being concentrated proximate the substrate and the second plurality of filler particles being concentrated proximate the semiconductor chip so that a bulk modulus of the underfill layer being larger proximate the substrate than proximate the semiconductor chip.

2. The method of claim 1, wherein the forming the underfill layer comprises depositing a polymeric resin and wherein the first plurality of filler particles comprises alumina and the second plurality of filler particles comprise silica.

3. The method of claim 1, wherein the forming the underfill layer comprises depositing a polymeric resin and wherein the first and second pluralities of filler particles comprise round particles.

4. The method of claim 1, wherein the coupling a semiconductor chip comprises coupling a microprocessor.

5. A method of manufacturing, comprising:
   forming a partially cured polymeric material layer having first bulk modulus on a surface of a semiconductor chip;
   coupling the semiconductor chip to a substrate with the partially cured polymeric material facing towards the substrate to leave a gap therebetween; and
   forming an underfill layer in the gap between the partially cured polymeric material, the underfill layer including a plurality of filler particles providing the underfill layer with a second bulk modulus larger than the first bulk modulus of the partially cured polymeric material layer.

6. The method of claim 5, wherein the forming the underfill layer comprises depositing a polymeric resin and wherein the plurality of filler particles comprises alumina, silica, diamond or sapphire.

7. The method of claim 5, wherein the forming the underfill layer comprises depositing a polymeric resin and wherein the plurality of filler particles comprises round particles.

8. The method of claim 5, wherein the coupling a semiconductor chip comprises coupling a microprocessor.

9. An apparatus, comprising:
   a semiconductor chip coupled to a substrate; and
   an underfill layer between the semiconductor chip and the substrate, the underfill layer including a first plurality of filler particles having a first average density and a second plurality of filler particles having a second average density lower than the first average density such that the first plurality of filler particles being concentrated proximate the substrate and the second plurality of filler particles being concentrated proximate the semiconductor chip so that a bulk modulus of the underfill layer being larger proximate the substrate than proximate the semiconductor chip.

10. The apparatus of claim 9, wherein the underfill layer comprises a polymeric resin and wherein the first plurality of filler particles comprises alumina and the second plurality of filler particles comprises silica.

11. The apparatus of claim 9, wherein the underfill layer comprises a polymeric resin and wherein the first and second pluralities of filler particles comprise round particles.

12. The apparatus of claim 9, wherein the semiconductor chip comprises a microprocessor.

13. An apparatus, comprising:
   forming a partially cured polymeric material layer having first bulk modulus on a surface of a semiconductor chip;
   semiconductor chip coupled to a substrate; and
   an underfill layer between the semiconductor chip and the substrate, the underfill layer having a first layer proximate the semiconductor chip and having a first bulk modulus, and a second layer proximate the substrate including a plurality of filler particles providing the second layer with a second bulk modulus larger than the first bulk modulus of the first layer.

14. The apparatus of claim 13, wherein the second layer comprises a polymeric resin and wherein the plurality of filler particles comprises alumina, silica, diamond or sapphire.

15. The apparatus of claim 13, wherein the semiconductor chip comprises a microprocessor.

16. A method of manufacturing, comprising:
   coupling a semiconductor chip to a substrate to leave a gap therebetween; and
   forming an underfill layer in the gap, the underfill layer including a first portion proximate the substrate that has a first coefficient of thermal expansion and a majority concentration of first filler particles with a first average size, and a second portion proximate the semiconductor chip that has a second coefficient of thermal expansion greater than the first coefficient of thermal expansion and a majority concentration of second filler particles with a second average size smaller than the first average size.

17. The method of claim 16, wherein the forming the underfill layer comprises depositing a polymeric resin and wherein the first and second filler particles comprise silica particles.

18. The method of claim 16, wherein the forming the underfill layer comprises depositing a polymeric resin and wherein the first and second filler particles comprise round particles.

19. The method of claim 16, wherein the coupling a semiconductor chip comprises coupling a microprocessor.

20. An apparatus, comprising:
a semiconductor chip coupled to a substrate; and
an underfill layer between the semiconductor chip and the substrate, the underfill layer including a first portion proximate the substrate that has a first coefficient of thermal expansion and a majority concentration of first filler particles with a first average size, and a second portion proximate the semiconductor chip that has a second coefficient of thermal expansion greater than the first coefficient of thermal expansion and a majority concentration of second filler particles with a second average size smaller than the first average size.

21. The apparatus of claim 20, wherein the underfill layer comprises a polymeric resin and wherein the first and second filler particles comprise silica particles.

22. The apparatus of claim 20, wherein the underfill layer comprises a polymeric resin and wherein the first and second filler particles comprise round particles.

23. The apparatus of claim 20, wherein the semiconductor chip comprises a microprocessor.

* * * * *